United States Patent
Masleid et al.

(10) Patent No.: US 7,977,995 B2
(45) Date of Patent: Jul. 12, 2011

(54) CONFIGURABLE PULSE GENERATOR

(75) Inventors: Robert P. Masleid, Monte Sereno, CA (US); Anand Dixit, Mountain View, CA (US)

(73) Assignee: Oracle America, Inc., Redwood Shores, CA (US)

( * ) Notice: Subject to any disclaimer, the term of this patent is extended or adjusted under 35 U.S.C. 154(b) by 79 days.

(21) Appl. No.: 12/494,663

(22) Filed: Jun. 30, 2009

(65) Prior Publication Data

US 2010/0327937 A1 Dec. 30, 2010

(51) Int. Cl.
*G06F 1/04* (2006.01)
(52) U.S. Cl. .... 327/291; 327/294; 327/299; 331/DIG. 3
(58) Field of Classification Search .......................... None
See application file for complete search history.

(56) References Cited

U.S. PATENT DOCUMENTS

| | | | | |
|---|---|---|---|---|
| 5,416,445 A | * | 5/1995 | Narahara | 331/49 |
| 5,532,652 A | * | 7/1996 | Koyama et al. | 331/116 FE |
| 5,900,787 A | * | 5/1999 | Yoshimura | 331/116 FE |
| 6,163,219 A | * | 12/2000 | Kanasugi | 330/282 |

* cited by examiner

*Primary Examiner* — An T Luu
(74) *Attorney, Agent, or Firm* — Park, Vaughan, Fleming & Dowler LLP; Anthony P. Jones

(57) ABSTRACT

The described embodiments provide a circuit that can be configured as a pulse generator or as an oscillator. The circuit includes a pulse generator circuit and a test circuit that is coupled to the pulse generator circuit. In the described embodiments, an disable signal is coupled to the test circuit. When the disable signal is asserted, the test circuit is disabled, and the pulse generator circuit outputs pulses of a predetermined duration. In contrast, when the disable signal is deasserted, the test circuit is enabled, and the pulse generator circuit outputs an oscillating signal.

20 Claims, 10 Drawing Sheets

CONFIGURABLE PULSE GENERATOR

BACKGROUND

1. Related Applications

This application is related to U.S. patent application Ser. No. 12/495,088, entitled "Inverting Difference Oscillator", filing date 30 Jun. 2009, by inventors Robert P. Masleid and Anand Dixit. This application is further related to U.S. patent application Ser. No. 12/425,176, entitled "Economy Precision Pulse Generator," filing date 16 Apr. 2009, by inventors Robert P. Masleid, David J. Greenhill, and Bijoy Kalloor.

2. Field of the Invention

The described embodiments relate to pulse generator circuits. More specifically, the described embodiments relate to a configurable pulse generator circuit.

3. Related Art

Many integrated circuits use pulsed signals for control and timing purposes. For example, microprocessors, application-specific integrated circuits (ASICS), or other high-speed integrated circuits can include pulse latches that are controlled or timed using pulsed signals. In another example, memory circuits such as synchronous random-access memories (SRAMs) can use pulsed signals to control memory operations.

In many integrated circuits, the timing requirements for pulsed signals dictate that the pulse may be only tens of picoseconds in width. Moreover, the pulsed signals may also be required to be within a few picoseconds of the required pulse width to avoid causing errors in downstream circuits. Consequently, it is important to be able to accurately measure the width of the pulse during testing and validation. However, accurately measuring the width of such pulses is difficult because of the short duration of the pulses. More specifically, because the pulses are so short, it is effectively impossible to send the pulses off-chip to be measured using specialized measuring equipment. In addition, measuring the duration of the pulses using on-chip structures is also impractical because of the complexity and size of such on-chip structures.

SUMMARY

The described embodiments provide a circuit that can be configured as a pulse generator or as an oscillator. The circuit includes a pulse generator circuit and a test circuit that is coupled to the pulse generator circuit. In the described embodiments, a disable signal is coupled to the test circuit. When the disable signal is asserted, the test circuit is disabled, and the pulse generator circuit outputs pulses of a predetermined duration. In contrast, when the disable signal is deasserted, the test circuit is enabled, and the pulse generator circuit outputs an oscillating signal.

In some embodiments, the circuit includes an n-type metal-oxide-semiconductor field-effect (NMOS) transistor coupled between an internal node in the pulse generator circuit and VSS. A gate connection for the NMOS transistor is coupled to a feedback path in the pulse generator circuit. The circuit also includes two p-type metal-oxide-semiconductor field-effect (PMOS) transistors in the test circuit coupled between the internal node in the pulse generator circuit and VDD. A gate connection for the first of the PMOS transistors is coupled to the disable signal, and a gate connection for the second of the PMOS transistors is coupled to the feedback path.

In some embodiments, the circuit includes a multiplexer (MUX) with N inputs. An output of the MUX is coupled to the gate connection of the second of the PMOS transistors in the test circuit and to the gate connection of the NMOS transistor in the pulse generator circuit. Each input of the MUX is coupled to one of a set of N separate feedback paths coupled between the pulse generator circuit and the MUX. In these embodiments, based on a state of at least one select signal input to the MUX, the MUX couples a selected feedback path to the gates of the second of the PMOS transistors in the test circuit and to the NMOS transistor in the pulse generator circuit.

In some embodiments, the set of feedback paths includes: (1) a first feedback path three gate delays in length; (2) a second feedback path five gate delays in length; and (3) a third feedback path seven gate delays in length.

In some embodiments, each feedback path can include one or more circuit elements in the pulse circuit and one or more circuit elements coupled to an output of the pulse circuit.

In some embodiments, the circuit includes a frequency-reduction circuit coupled to the pulse generator. The frequency-reduction circuit is configured to take the oscillating signal output by the pulse generator as an input and to output a signal with a frequency that is a predetermined fraction of the frequency of the oscillating signal output by the pulse generator.

In some embodiments, the circuit includes a recursive multiplexer coupled to the pulse generator circuit and to one or more other pulse generator circuits. The recursive multiplexer includes a set of OR gates coupled in series. One of the inputs of each OR gate is coupled to a different one of the pulse generator circuits, and another input of each OR gate is coupled to either VSS or to an output of a previous OR gate. The last OR gate in the recursive multiplexer outputs a signal or a combination of signals received by the recursive multiplexer from the pulse generator circuits.

In some embodiments, the circuit includes a monitoring device coupled to an output of the pulse generator circuit. In these embodiments, the monitoring device receives the oscillating signal output from the pulse generator circuit and uses the oscillating signal to compute a pulse duration of a pulse output from the pulse generator circuit.

BRIEF DESCRIPTION OF THE FIGURES

In the figures, like reference numerals refer to the same figure elements.

DETAILED DESCRIPTION

Figure 1:
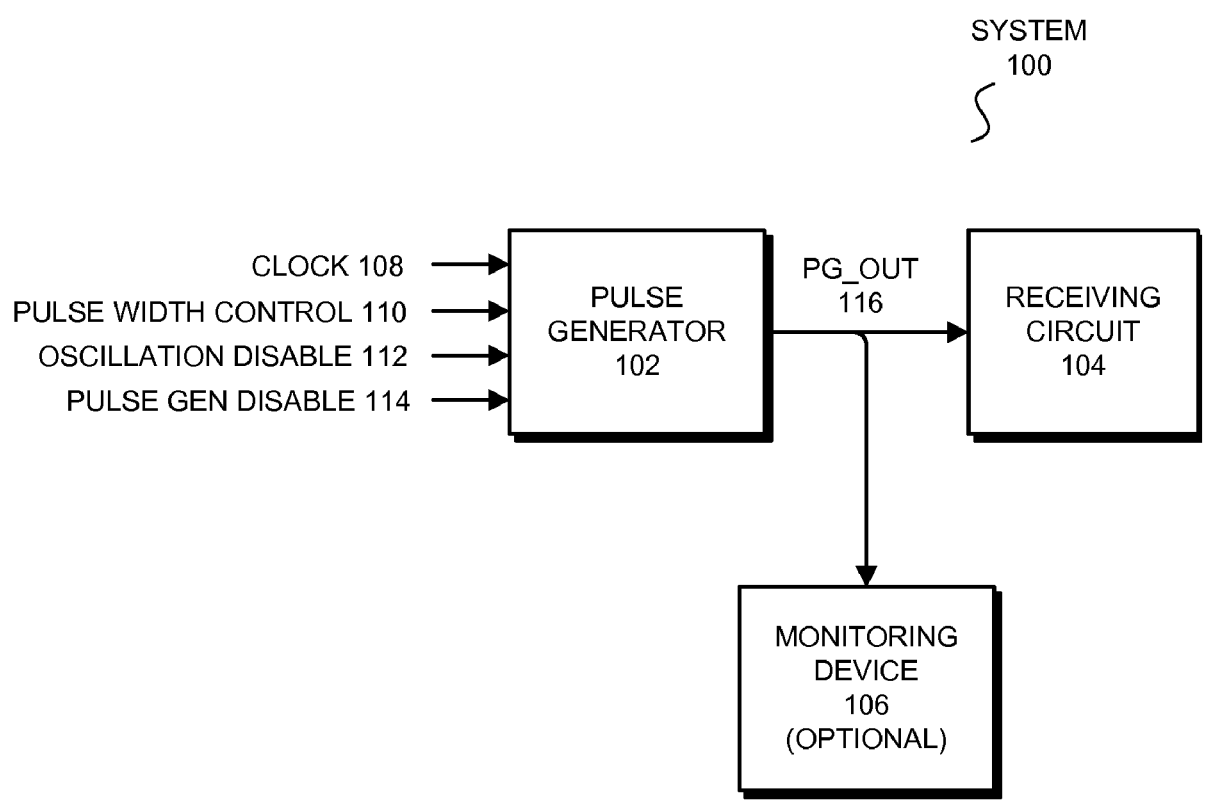
FIG. 1 presents a block diagram of a system in accordance with the described embodiments.

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Terminology

In this description we characterize circuit paths in terms of the "gate delays" on the path. Generally, a gate delay is the time taken for a signal to propagate through a gate (e.g., an inverter, a NAND gate, a complex gate, etc.). Thus, the gate delay for a circuit path is the sum of the individual gate delays of gates on the circuit path. For example, a path where a signal traverses three inverters can be referred to as a path with three gate delays, or as a path three gate delays in length. Note that the gate delay for a given path can include delay through separate transistors on the path, as well as logic gates.

In the following description, we refer to signals being "asserted" or "deasserted." When a signal is asserted, the signal is set to a logical "1" value. In some embodiments, the logical 1 is equivalent to the voltage VDD in the system. For example, the logical 1 is a voltage of 1.2 V in a system where VDD is 1.2 V. When a signal is deasserted, the signal is set to a logical "0" value, which is typically VSS or 0 V. Note that although we describe embodiments where signals are asserted and deasserted using the indicated voltages, alternative embodiments can use different voltages.

System

FIG. 1 presents a block diagram of a system 100 in accordance with the described embodiments. System 100 includes pulse generator 102 coupled to a receiving circuit 104. System 100 also includes optional monitoring device 106.

Pulse generator 102 can be any circuit that can be configured to generate either a pulse or an oscillating waveform in a signal output on the pg_out 116 node or can be disabled, which causes pulse generator 102 to output a steady signal on pg_out 116. More specifically, pulse generator 102 includes circuit structures that can be used to configure pulse generator 102 either as a pulse generator or as an oscillator, or to disable pulse generator 102, depending on the state of disable signal inputs to pulse generator 102 (e.g., oscillation disable 112 and pulse gen disable 114).

Receiving circuit 104 can be any type of circuit that uses the pulse or the oscillating waveform generated by pulse generator 102 as a timing signal, a control signal, a reference signal, a data signal, or for another purpose. For example, receiving circuit 104 can be, but is not limited to, one or more individual circuit elements (e.g., pulse latches, domino circuits, memory elements, control circuits, etc.), a synchronous random-access memory (SRAM) or dynamic random-access memory (DRAM), a microprocessor, a controller, an application-specific integrated circuit (ASIC).

As shown in FIG. 1, pulse generator 102 takes clock 108, pulse width control 110, oscillation disable 112, and pulse generator disable ("pulse gen disable") 114 as inputs. Clock 108 is a clock signal used as a triggering signal for pulse generator 102. More specifically, depending on the configuration of pulse generator 102, a given edge or voltage level in clock 108 can cause pulse generator 102 to generate a pulse or an oscillating signal on the pg_out 116.

Pulse width control 110 is a control signal that can be used to configure the duration of the pulse or the frequency of the oscillating signal output by pulse generator 102 on pg_out 116. In the described embodiments, pulse generator 102 includes a number of feedback paths, each of which has a different number of circuit elements and, hence, a different delay. For example, in some embodiments, a first feedback path is three gate delays, a second feedback path is five gate delays, and a third feedback path is seven gate delays. In these embodiments, pulse width control 110 can be used to select one of the feedback paths in accordance with the desired width of the output pulse or frequency of the oscillating signal. For example, assuming that the desired output pulse duration is three fan-out four ("3 FO4") in the example above with three feedback paths, the first feedback path can be selected. In contrast, if the desired output pulse duration is 5 FO4, the second feedback path can be selected.

In some embodiments, pulse width control 110 includes two or more separate signals. In these embodiments, one signal at a time can be asserted to select a particular feedback path, thereby selecting the delay and, hence, the duration of the pulses or the period of the oscillating signal output by pulse generator 102. For example, given the embodiment described above with three feedback paths, pulse width control 110 can include three separate signals for selecting the feedback path.

Oscillation disable 112 is a control signal that can be used to configure pulse generator 102 as an oscillator or as a pulse generator. When oscillation disable 112 is asserted (e.g., is a logical "1"), pulse generator 102 is configured as a pulse generator. In contrast, when oscillation disable 112 is deasserted (e.g., is a logical "0"), pulse generator 102 is configured as an oscillator. When configured as an oscillator, instead of outputting a pulse on pg_out 116, pulse generator 102 outputs an oscillating waveform. In some embodiments, oscillation disable 112 is coupled to one or more circuit elements within pulse generator 102 that are enabled when oscillation disable 112 is deasserted to configure pulse generator 102 as a ring oscillator.

Pulse generator disable ("pulse gen disable") 114 is a control signal that can be used to prevent pulse generator 102 from outputting any varying signal (i.e, pulsed or oscillating)

on pg_out 116. When asserted, pulse gen disable 114 causes pulse generator 102 to output a steady signal equivalent to VDD (i.e., logical "1").

Monitoring device 106 is a device that takes the signal output by pulse generator 102 on pg_out 116 as an input. In some embodiments, monitoring device 106 measures the signal output by pulse generator 102 to determine a pulse width (i.e., duration) of the pulse output by pulse generator 102.

In some embodiments, monitoring device 106 does not directly measure the pulses generated by pulse generator 102 to determine the duration of the pulse. Instead, monitoring device 106 measures the oscillating signal output by pulse generator 102 and uses the oscillating signal to compute the duration of the pulse that is output by pulse generator 102. More specifically, in these embodiments, pulse generator 102 can be configured (e.g., by deasserting oscillation disable 112) to generate an oscillating signal, and monitoring device 106 can use well-known techniques to measure the frequency of the oscillation signal output by pulse generator 102. Monitoring device 106 can then use the measured frequency to compute the pulse width. In some embodiments, the period of the oscillating waveform is twice the pulse width of the pulse, and the process of computing pulse width from frequency involves determining the period from the frequency and dividing the period by two.

Because in these embodiments the pulse width is computed using the period of the oscillating waveform instead of the duration of the pulse itself, monitoring device 106 can use less complex circuits to measure the pulse width. As described below, in order to enable even simpler pulse width computations, and hence simpler monitoring circuits, some embodiments divide-down or otherwise slow the oscillating signal to a frequency that can be orders of magnitude lower than the frequency of the oscillation signal output from pulse generator 102.

Monitoring device 106 can be coupled to a display device, a computer-readable storage medium, or another device. Upon determining the duration of the pulse, monitoring device 106 can then display the results to a user or write the results to the computer-readable storage medium. In some embodiments, monitoring device 106 is coupled to or includes an adjustment device (not shown) that can be used to make adjustments to operating parameters, such as an operating voltage for pulse generator 102. In these embodiments, monitoring device 106 can use the determined pulse duration to determine a voltage adjustment (or another adjustment) that is to be made for pulse generator 102.

Although shown as part of system 100 in FIG. 1, in some embodiments, monitoring device 106 is not included in a device that includes pulse generator 102 and receiving circuit 104. In other words, monitoring device 106 resides in a separate device. For example, pulse generator 102 and receiving circuit 104 can be included on a first integrated circuit chip (e.g., microprocessor, controller, ASIC, etc.), while monitoring device 106 is on a separate integrated circuit chip or device that is coupled to the first integrated circuit chip. As described below, the oscillating signal output by pulse generator 102 can be slowed to a frequency that enables monitoring device 106 to both receive the oscillating signal off-chip and accurately measure the oscillating signal.

As indicated in FIG. 1, monitoring device 106 is optional. Pulse generator 102 can also be configured as either a pulse generator or as an oscillator whether or not monitoring device 106 is present in system 100. Moreover, there may be any number of reasons for configuring pulse generator 102 as a pulse generator or an oscillator. For example, the oscillating signal can be used to control one set of circuits, while the pulsed signal is used to control another. Alternatively, the oscillating signal can be used to control a circuit in a first mode, while the pulsed signal is used to control the circuit in a second mode.

System 100 can be incorporated into many different types of electronic devices. For example, system 100 can be part of a desktop computer, a laptop computer, a server, a media player, an appliance, a cellular phone, a piece of testing equipment, a network appliance, a personal digital assistant (PDA), a hybrid device (i.e., a "smart phone") or another electronic device.

In some embodiments, some or all of system 100 is fabricated using one or more integrated circuit chips. In these embodiments, the pulsed or oscillating signals generated within a given integrated circuit chip can be passed off-chip to other integrated circuit chips for handling, forwarding, use, modification, or to be measured. For example, in some embodiments, pulse generator 102 and receiving circuit 104 are fabricated in one integrated circuit chip, while monitoring device 106 is fabricated in another. In these embodiments, typical off-chip communication structures (i.e., traces in a circuit board, bonding pads, etc.) can be used for communicating between the integrated circuit chips.

Although we use specific components to describe system 100, in alternative embodiments different components may be present in system 100. For example, system 100 may include one or more additional receiving circuits 104. In addition, although we show the input signals to pulse generator 102 as including a number of signals, in alternative embodiments, more or fewer signals can be used as inputs for pulse generator 102.

Moreover, in some embodiments, one or more frequency-reduction circuits can be coupled to the output of pulse generator 102. In these embodiments, each frequency-reduction circuit can reduce the oscillation frequency of the oscillating signal output by pulse generator 102 by a predetermined fraction or amount.

Pulse Generator

Figure 2A:
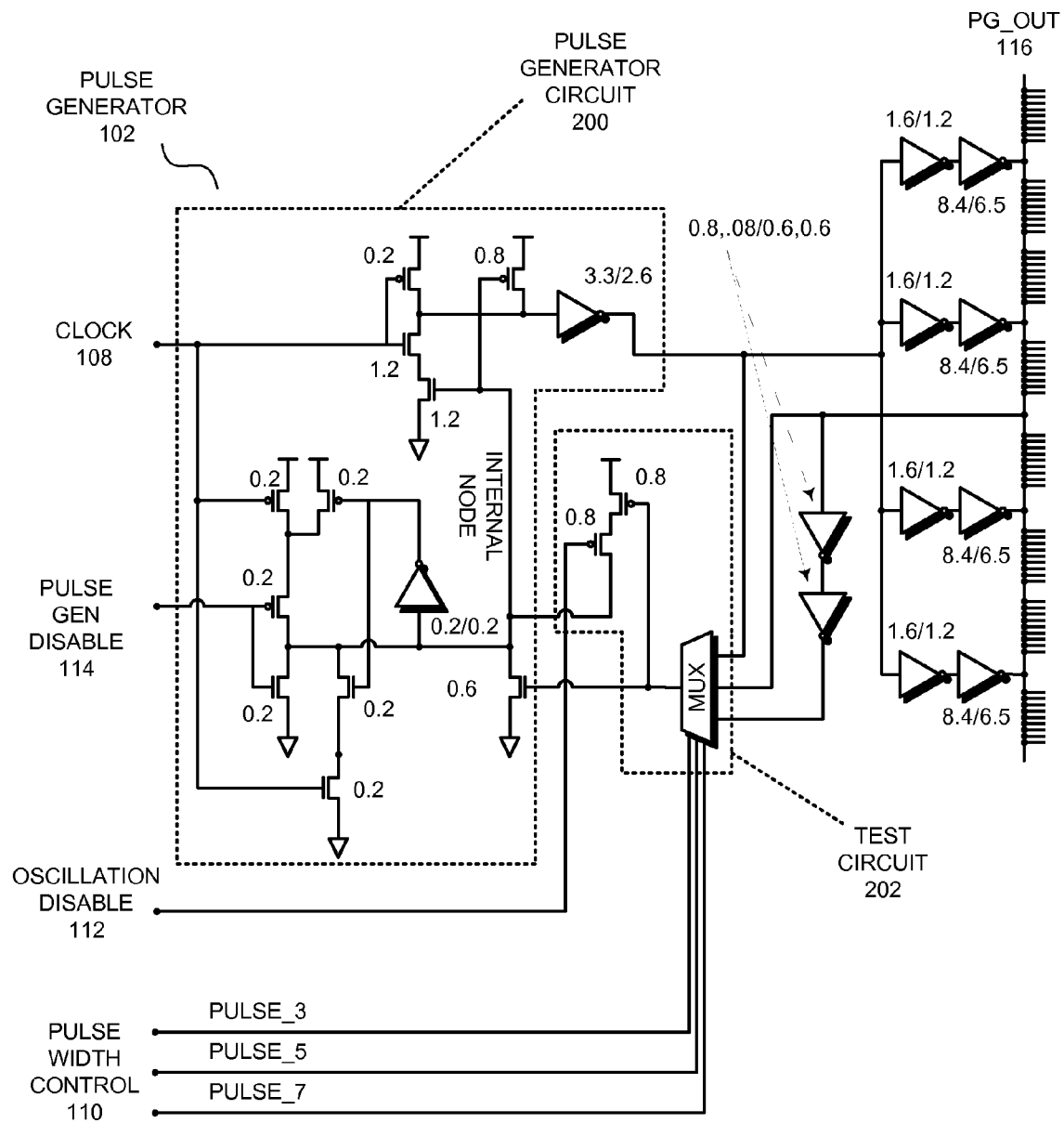
FIG. 2A presents a schematic view of a pulse generator in accordance with the described embodiments.

FIG. 2A presents a schematic view of pulse generator 102 in accordance with some embodiments. Pulse generator 102 includes pulse generator circuit 200 and test circuit 202. Generally, pulse generator circuit 200 generates pulses on output pg_out 116 when test circuit 202 is disabled, but generates an oscillating signal on pg_out 116 when test circuit 202 is enabled. As described above with respect to FIG. 1, pulse generator 102 takes clock 108, pulse gen disable 114, oscillation disable 112, and pulse width control 110 as inputs.

In the illustrated embodiment, pulse width control 110 includes the pulse_3, pulse_5, and pulse_7 signals (collectively, "pulse_3-7"). The pulse_3-7 signals are the select signals for the MUX, causing the MUX to forward a selected feedback path to pulse generator circuit 200. The feedback paths that can be selected using pulse_3-7 are indicated by the bold line in FIGS. 2B-2D.

Figure 2B:
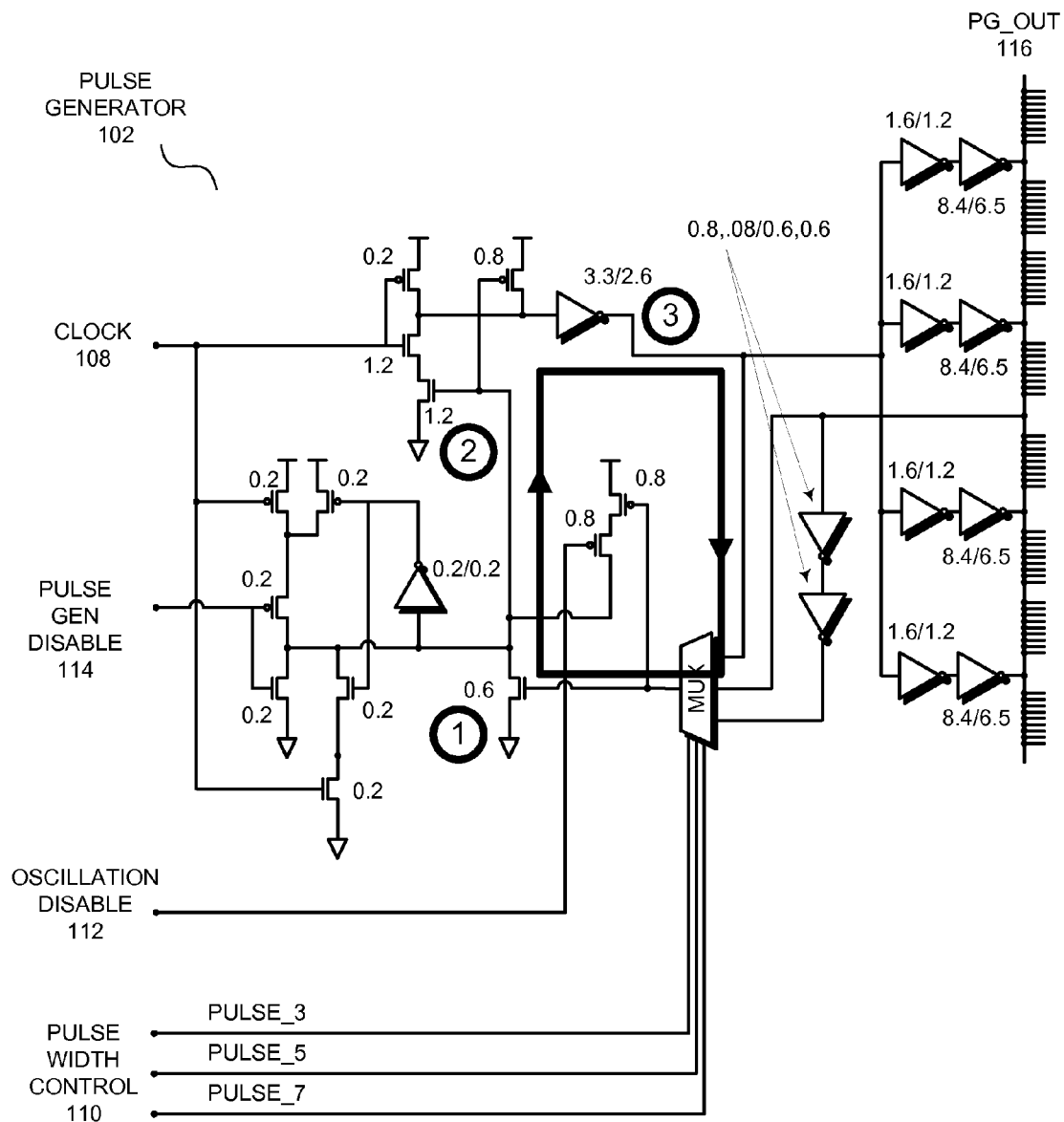
FIGS. 2B-2D present schematic views of feedback paths in a pulse generator in accordance with the described embodiments.
Figure 2C:
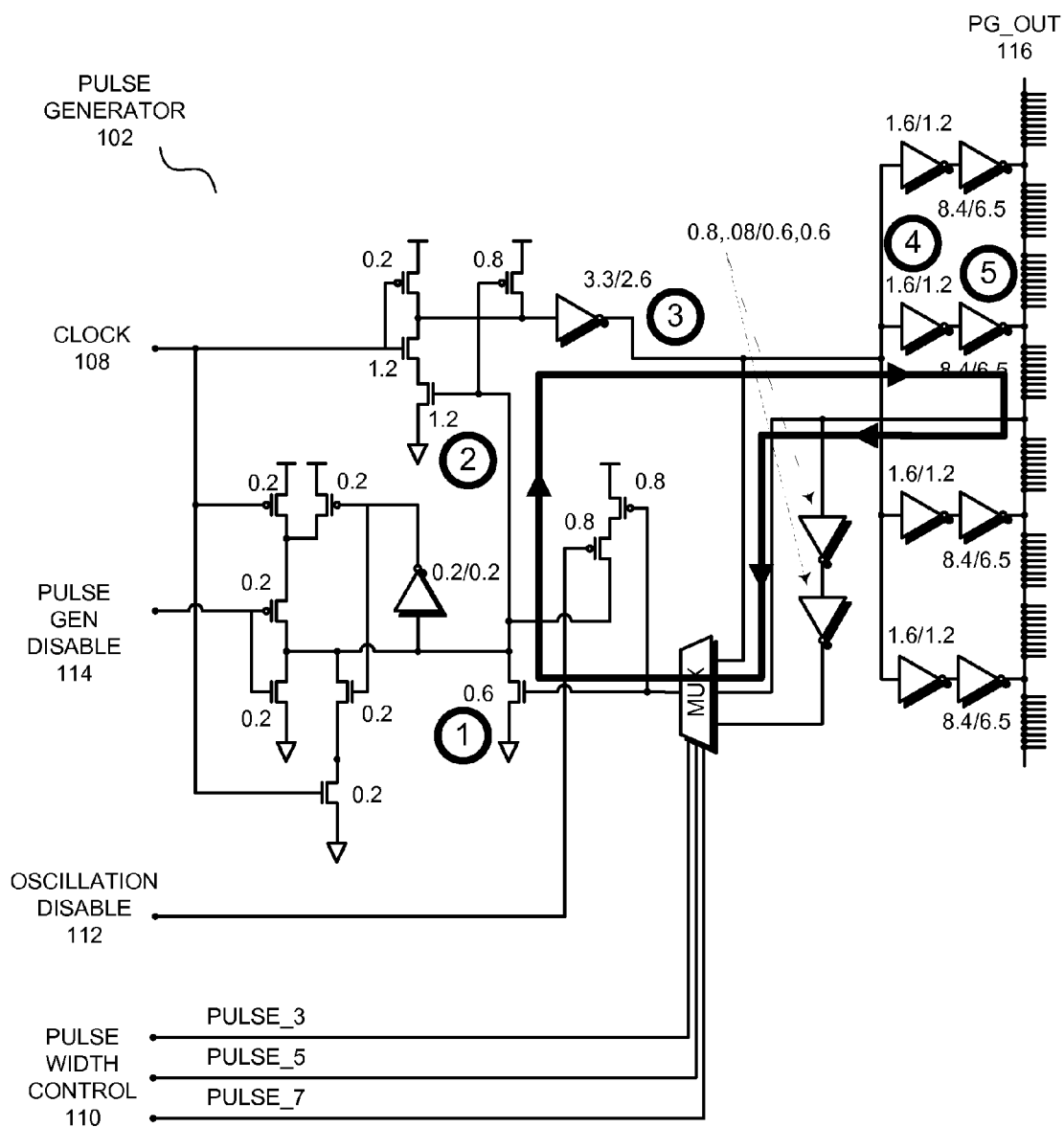
Figure 2D:
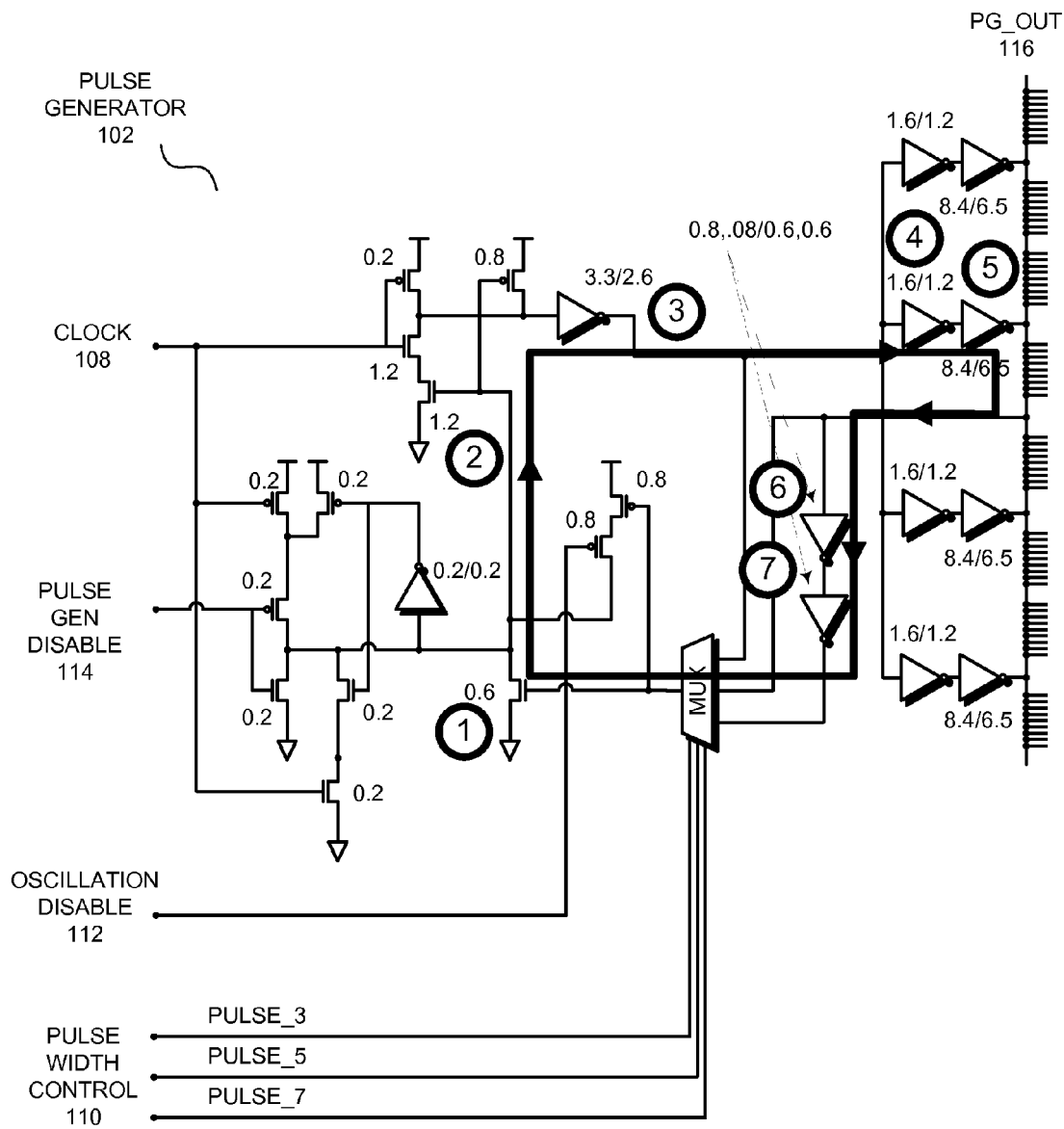

More specifically, FIG. 2B shows the feedback path selected by pulse_3 in accordance with the described embodiments. As shown in FIG. 2B, the feedback path includes 3 gate delays (labeled using encircled numbers). When selected, this feedback path causes pulse generator circuit 200 to generate a pulse with a width of 3 FO4. Although the duration of a 3 FO4 pulse depends on factors such as semiconductor process, feature sizes, wire lengths, etc., in some embodiments, a 3 FO4 pulse can be approximately 45 pS in duration. FIG. 2C shows the feedback path selected by pulse_5 in accordance with the described embodiments. As shown in FIG. 2C, the feedback path includes 5 gate delays. When selected, this feedback path causes pulse generator circuit 200 to generate a pulse with a width of 5 FO4. FIG. 2D shows the feedback path selected by pulse_7 in accordance with the described embodiments. As shown in FIG. 2D, the feedback path includes 7 gate delays. When selected, this feedback path causes pulse generator circuit 200 to generate a pulse with a width of 7 FO4.

As shown in FIG. 2A, the output of the MUX is coupled to the gate connection of an n-type metal-oxide-semiconductor field-effect (NMOS) transistor in pulse generator circuit 200 and the top p-type metal-oxide-semiconductor field-effect (PMOS) transistor in test circuit 202, while oscillation disable 112 is coupled to the bottom PMOS transistor in test circuit 202. When oscillation disable 112 is asserted, the bottom PMOS transistor in test circuit 202 is shut off, thereby leaving the NMOS transistor as the only transistor coupled to the output of the MUX (i.e., to the selected feedback path through the MUX) that can affect the internal node of pulse generator circuit 200. In this configuration, pulse generator circuit 200 therefore generates pulses on the pg_out 116 in response to rising edges on clock 108.

In contrast, when oscillation disable 112 is deasserted, the bottom PMOS transistor in test circuit 202 is enabled, and the PMOS transistors in test circuit 202 and the NMOS transistor in pulse generator circuit 200 form an inversion in the feedback path of pulse generator circuit 200. This inversion, in combination with the other inversions in the possible feedback paths (see encircled numbers 2-7 in FIGS. 2B-2D), forms a ring oscillator. Ring oscillators, as is well-known in the art, are circuits with odd numbers of inverters that generate oscillating waveforms.

In some embodiments, when oscillation disable 112 is asserted (i.e., when pulse generator is configured as a ring oscillator), clock 108 is held in a logical high state (i.e., held at VDD). In other words, in these embodiments, clock 108 does not oscillate when pulse generator is configured as a ring oscillator.

As is described above, depending on the select signal that is asserted among pulse_3-7, pulse generator circuit 200 can generate pulses of various lengths, from 3 FO4 to 7 FO4. When oscillation disable 112 is deasserted, thereby forming the above-described ring oscillator, pulse generator circuit 200 (in combination with test circuit 202) generates an oscillating waveform with a period that is twice the pulse duration produced by the pulse generator circuit using a given feedback path. For example, if pulse_3 is enabled, the duration of the pulse output by pulse generator 102 is 3 FO4 when pulse generator 102 is configured as a pulse generator, and the period of the oscillating waveform is 6 FO4 when pulse generator 102 is configured as a ring oscillator.

Note that although we show particular gate sizes in FIGS. 2A-2D, in alternative embodiments, some or all of the gates can be different sizes. In addition, although the MUX is shown as part of test circuit 202, the MUX also selects the feedback path when oscillation disable 112 is asserted and pulse generator circuit 200 is outputting pulses.

Figure 3:
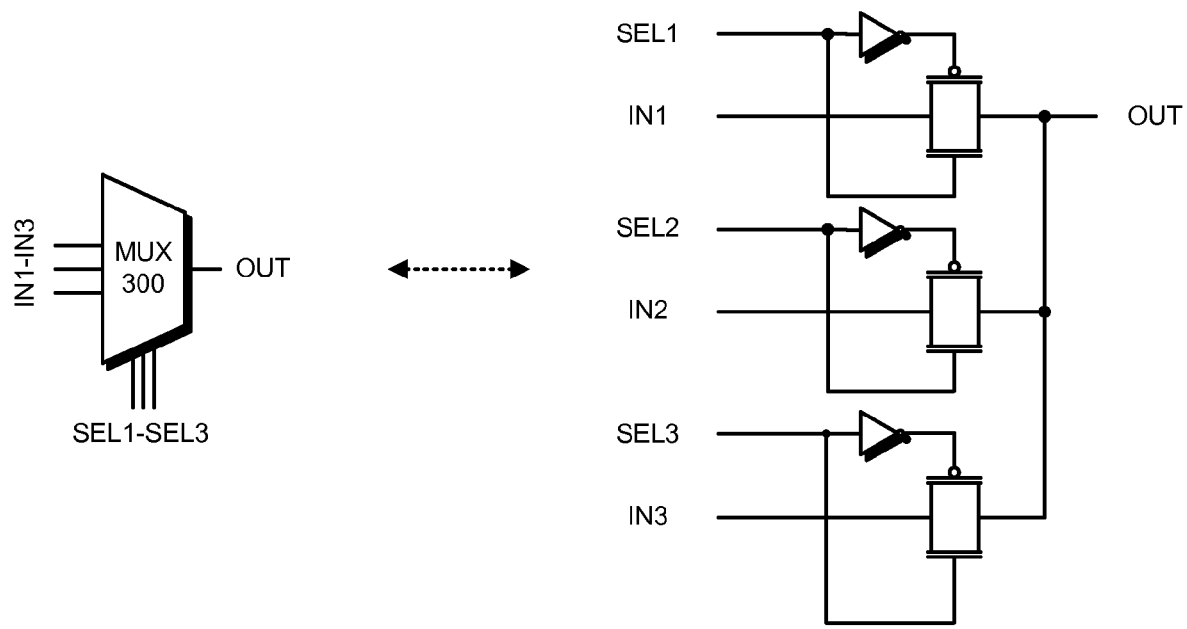
FIG. 3 presents a block diagram and a schematic of an exemplary multiplexer in accordance with the described embodiments.

FIG. 3 presents a block diagram and a schematic of an exemplary multiplexer (MUX) 300 in accordance with the described embodiments. More specifically, the left side of FIG. 3 presents a block diagram showing the inputs and outputs of MUX 300, while the right side presents a schematic. As can be seen from the right side of FIG. 3, some embodiments use a transmission gate MUX. In such multiplexers, a given input (i.e., IN1-IN3) is passed to the output (i.e., OUT) according to the select signal that is activated (SEL1-SEL3). The select signals for MUX 300 are mutually exclusive, so that only one select signal is active at a time.

Note that, although we present MUX 300 for the purposes of illustration, alternative embodiments use different types of multiplexers (such as a multiplexer including logic gates such as NAND gates, NOR gates, complex gates, etc.). Moreover, some alternative embodiments do not use a multiplexer, but instead use a different type of circuit for selecting the input that is passed to the output, such as a logic gate, a switch, or another circuit.

Configuring Pulse Generator as Oscillator

Figure 4:
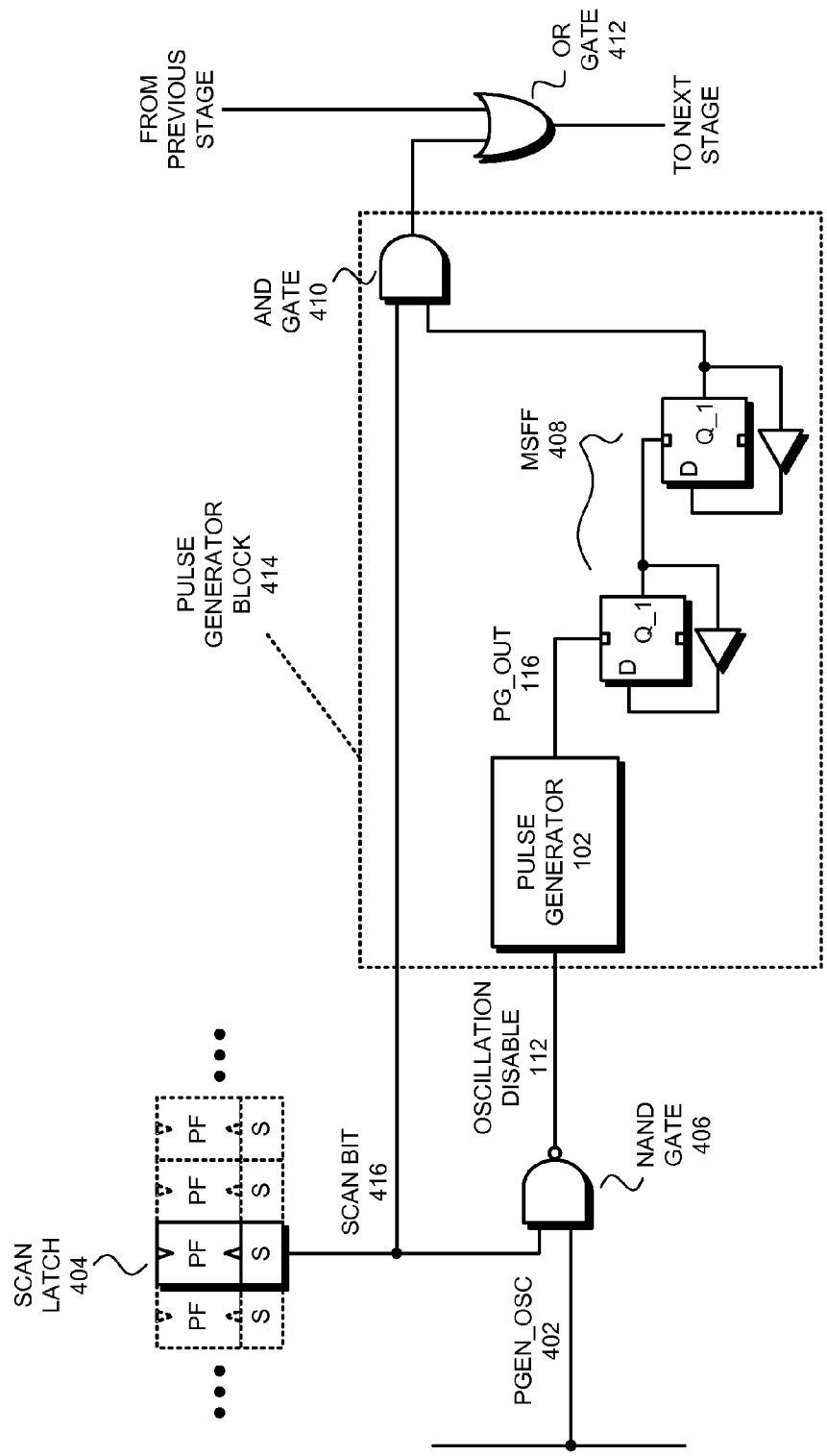
FIG. 4 presents a pulse generator with surrounding circuitry in accordance with the described embodiments.

FIG. 4 presents a pulse generator 102 with surrounding circuitry in accordance with the described embodiments. In the example circuit in FIG. 4, we show pulse generator 102 as a simplified version of the pulse generator circuit 200 shown in FIGS. 1-2. More specifically, we do not show clock 108 or some of the other input signals coupled to pulse generator 102. Although these signals are not shown for clarity's sake, these signals could be used as described above in the illustrated embodiment. (Note also that we refer to the circuitry in FIG. 4 as a whole as "the system," which can be a portion of system 100 or can be a different system.)

As shown in FIG. 4, in some embodiments, the oscillation disable 112 input to pulse generator 102 is formed by NANDing pgen_osc 402 with a scan bit 416 from a local scan latch 404 using NAND gate 406. In these embodiments, pgen_osc 402 can be a global enable signal that generally enables the configuration of one or more pulse generators (e.g., pulse generator 102) in the system as oscillator circuits. When asserted, pgen_osc 402 can place the system in a testing mode or an oscillator mode in which some or all pulse generator circuits are enabled to be configured as oscillators. When pgen_osc 402 is disabled, however, oscillation disable 112 is held in the asserted state, preventing the configuration of pulse generator 102 as an oscillator. (Recall from FIG. 2 that oscillation disable 112 is coupled to a PMOS transistor in test circuit 202, making the signal active-low for configuring pulse generator 102 as an oscillator circuit.)

Scan bit 416 from scan latch 404 is a local scan-enabling bit. Unlike the global pgen_osc 402, scan bit 416 can be specific to pulse generator 102 (or to a predetermined set of local pulse generators). In other words, a given scan latch can be used for triggering operations that are isolated to pulse generator 102 (or to the set of local pulse generators). Hence, when the global pgen_osc 402 signal is NANDed with the local scan bit 416, an oscillation disable 112 signal is formed that can be used to specifically configure pulse generator 102 as an oscillator (or as a pulse generator).

Note that using the scan bit 416 can leverage scan latches and scanning hardware that are present within a design for a different purpose. This can prevent a need for adding circuit structures for generating/storing/controlling local enable signals for configuring pulse generators as oscillators for testing purposes.

As also shown in FIG. 4, two master-slave flip-flops (MSFF) 408 are coupled in series to the output of pulse generator 102. The Q_1 output of each MSFF 408 is fed back to the D input of the MSFF 408, thereby configuring the MSFF 408 as a frequency divider that divides the frequency of an input oscillating (i.e., periodic) signal in half. The series pair of MSFFs 408 is used to divide the oscillating signal output by pulse generator 102 on pg_out 116 by four. For example, if the signal on pg_out 116 is oscillating with a frequency of 1024 MHz, the output of the second MSFF 408 oscillates at 256 MHz.

In the described embodiments, the MSFFs 408 are used to locally reduce the frequency of oscillation to make the pg_out 116 signal easier to handle in downstream circuitry. Assuming an embodiment where the 3 FO4 feedback path is selected and pulse generator 102 is configured as an oscillator, the period of the waveform can be approximately 90 pS (i.e., twice the 45 pS duration of the pulse generated by pulse generator 102 when pulse generator 102 is configured as a pulse generator with the 3 FO4 feedback path). Dividing the frequency by four leads to the period increasing by a factor of four to 360 pS, a waveform that is easier to handle in downstream circuits.

Figure 5:
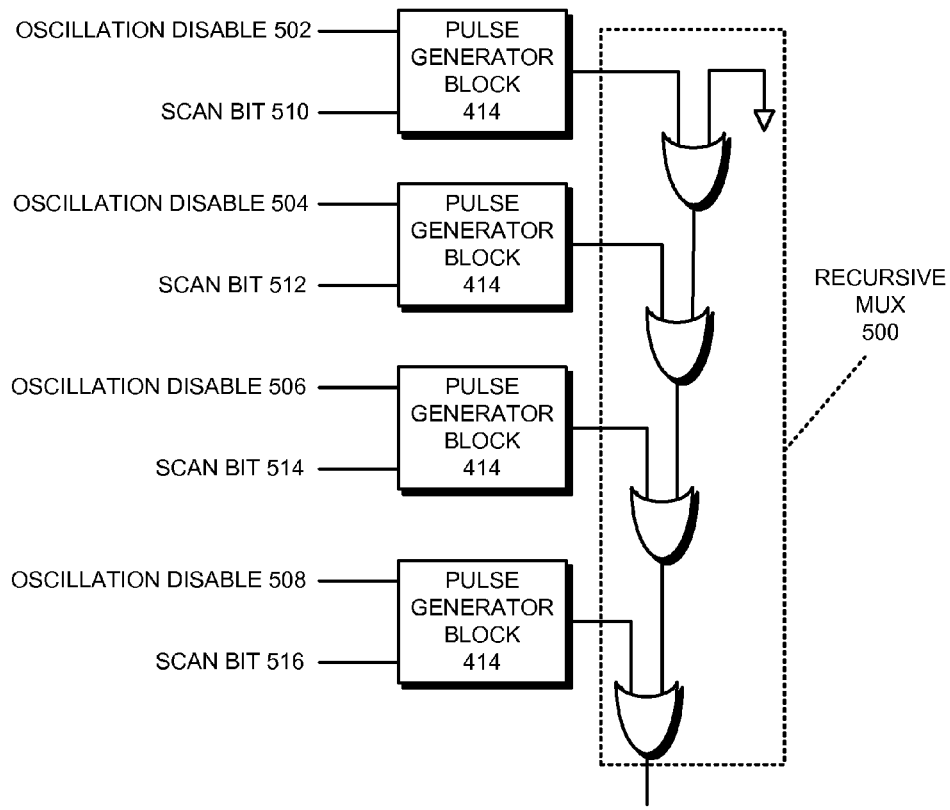
FIG. 5 presents a recursive multiplexer in accordance with the described embodiments.

After being divided in MSFFs 408, the signal output by pulse generator 102 is input into AND gate 410. The second input into AND gate 410 is the scan bit 416. As described above, the scan bit 416 can be asserted to select pulse generator 102 as a pulse generator to be configured as an oscillator circuit. In addition, scan bit 416 is used to control whether the output signal from the MSFF 408 series pair is forwarded to OR gate 412 to be passed along to the next stage in a recursive MUX (the recursive MUX is shown in FIG. 5). The output from the recursive MUX can then be further divided to reduce the frequency of the signal and passed to a monitoring device (e.g., monitoring device 106) to enable the determination of the pulse width of the pulses generated by pulse generator 102 or used for a different purpose. A circuit that further divides the signal is presented in FIGS. 6-7.

Recursive Multiplexer

FIG. 5 presents a recursive multiplexer (MUX) 500 in accordance with the described embodiments. FIG. 5 includes a number of pulse generator blocks 414 configured so that the output of each is coupled to one of the inputs of a two-input OR gate within the recursive MUX 500. Only the oscillation disable 502-508 and scan bit 510-516 signals are shown coupled to the pulse generator blocks 414 for clarity. However, the pulse generator blocks 414 operate in a similar way to the pulse generator block 414 shown in FIG. 4, including possibly being coupled to one or more of the signals shown in FIGS. 1-3.

Recursive MUX 500 passes an output from each pulse generator block 414 to a downstream circuit for measuring, monitoring, or other use. Within recursive MUX 500, received signals are passed freely through each OR gate, whether the signal is simply passed forward from a previous stage or is from the pulse generator block 414 in the stage. Thus, if multiple pulse generator blocks 414 are outputting signals at the same time, a combination of the signals is received at the output of recursive MUX 500 (generally resulting in an output signal with no useful meaning). However, when a particular pulse generator block 414 is configured as an oscillator, the local scan bit 416 that configures the pulse generator block 414 as an oscillator also enables the output signal from the pulse generator block 414 to be forwarded through AND gate 410. The described embodiments enable only one scan bit 416 at a time within a group of pulse generator blocks 414 coupled to the same recursive MUX 500 enables the output signal, thus preventing more than one pulse generator block 414 at a time from outputting a signal to recursive MUX 500. Consequently, in these embodiments, the signal output from recursive MUX 500 can be a single signal that is useful for determining the pulse duration of the particular active pulse generator block 414 or for using for other purposes.

Although generally limited by factors such as semiconductor process limitations, recursive MUX 500 may still include a large number of OR gates coupled in series. For example, some embodiments can include 150, 200, or more OR gates coupled in series.

Frequency-Reduction Circuit

Figure 6:
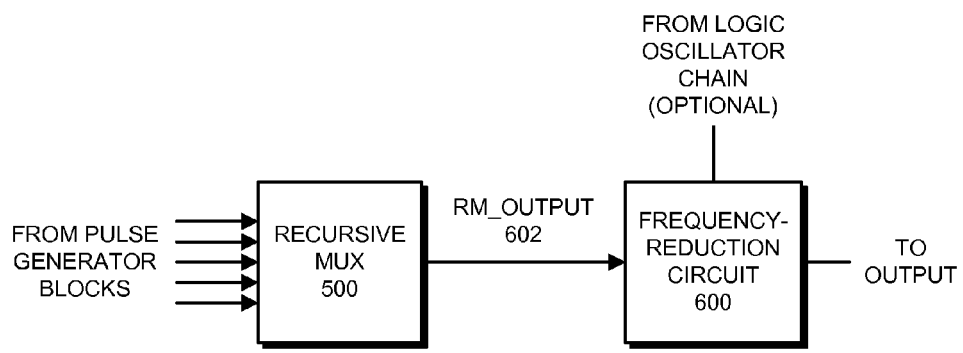
FIG. 6 shows a block diagram of a recursive multiplexer coupled to a frequency-reduction circuit in accordance with the described embodiments.

FIG. 6 shows a block diagram of a recursive MUX 500 coupled to a frequency-reduction circuit 600 in accordance with the described embodiments. As shown in FIG. 6, recursive MUX 500 receives a number of input signals from pulse generators (e.g., pulse generators 102 in FIG. 5) and outputs the rm_output 602 signal to frequency-reduction circuit 600. Generally, frequency-reduction circuit 600 reduces the frequency of the rm_ouput 602 signal to a frequency more easily passed to monitoring device 106 or to other circuits in system 100, either on-chip or off-chip. For example, frequency-reduction circuit 600 can reduce the frequency by a factor of one to four orders of magnitude so that the high-frequency signal passed by recursive MUX 500 can be more easily forwarded to downstream circuits.

Recall that in some embodiments an initial reduction in frequency can occur at the output of pulse generator 102, before the pg_out 116 signal is passed to recursive MUX 500. FIG. 4 shows one such embodiment. However, the initial reduction in frequency is sized so that the signal can be passed among and handled by devices on the same integrated circuit chip as pulse generator 102 so that pg_out 116 can be passed through recursive MUX 500. The initial reduction is sized in this way because space is typically at a premium on semiconductor integrated circuit chips, so placing large frequency-reduction circuits in more than a few locations on the semiconductor chip can be undesirable. Thus, recursive MUX 500 receives a signal that can be handled locally and then feeds that signal into frequency-reduction circuit 600, where a single large, remotely located circuit can reduce the frequency of the signals for a large group of pulse generators 102.

FIG. 6 also includes an optional input from a logic oscillator chain, which can include a number of oscillator circuits (which may or may not be specially-configured pulse generator circuits). As with rm_output 602, frequency-reduction circuit 600 reduces the frequency of the signal received from the logic oscillator chain.

Figure 7:
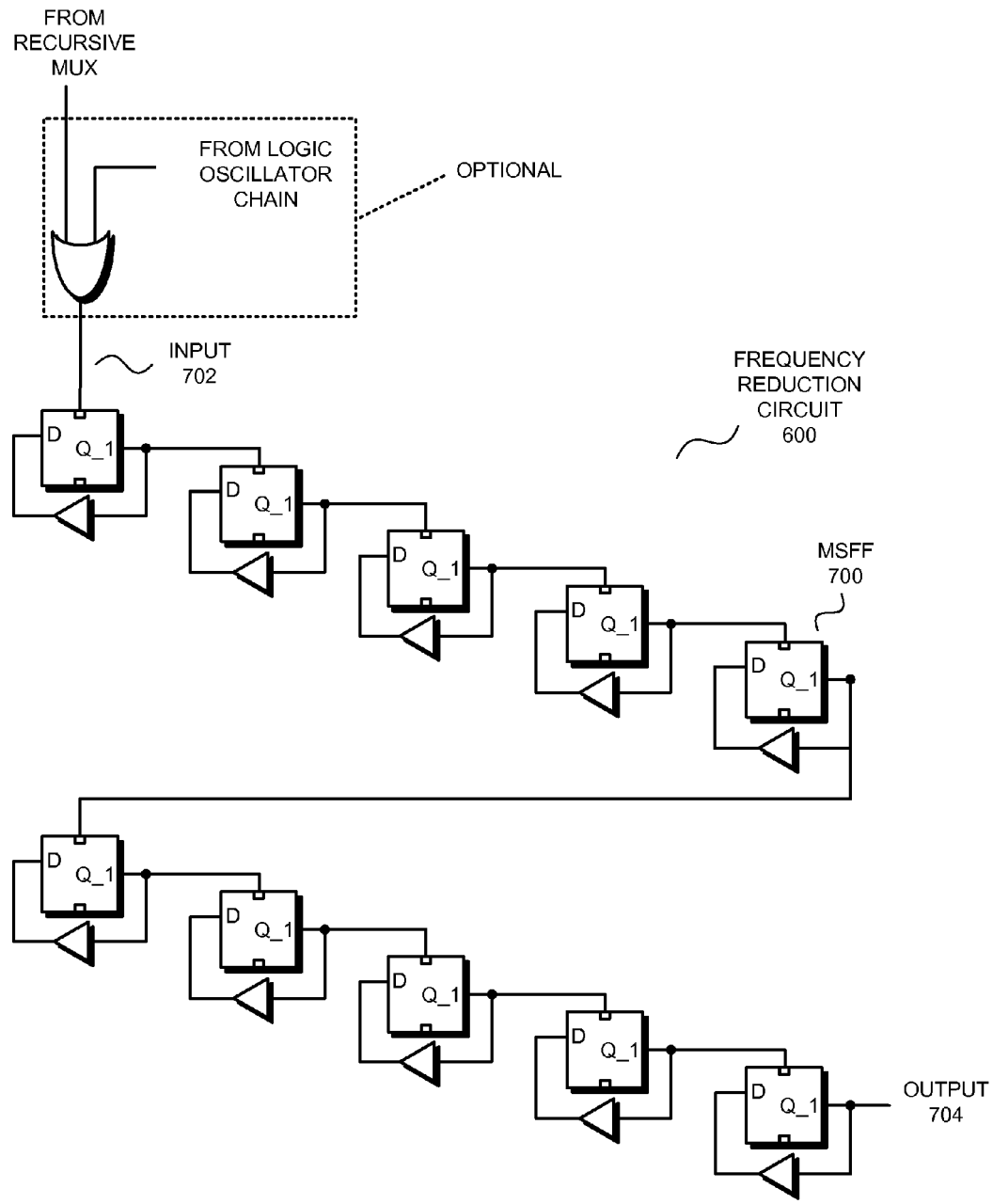
FIG. 7 presents a schematic of a frequency-reduction circuit in accordance with the described embodiments.

FIG. 7 presents a schematic of a frequency-reduction circuit 600 in accordance with the described embodiments. Much like the circuit for the initial frequency reduction shown in FIG. 4, this embodiment of the frequency-reduction circuit includes a number of master-slave flip-flops (MSFF) 700 coupled between an input 702 and an output 704. In the embodiment shown in FIG. 7, the division is by a factor of 1024 (i.e., each MSFF 700 divides the frequency in half, with ten MSFFs 700). Note that we present this embodiment of frequency-reduction circuit 600 as an example; alternative embodiments use different circuits for reducing the frequency.

Process for Configuring a Pulse Generator

Figure 8:
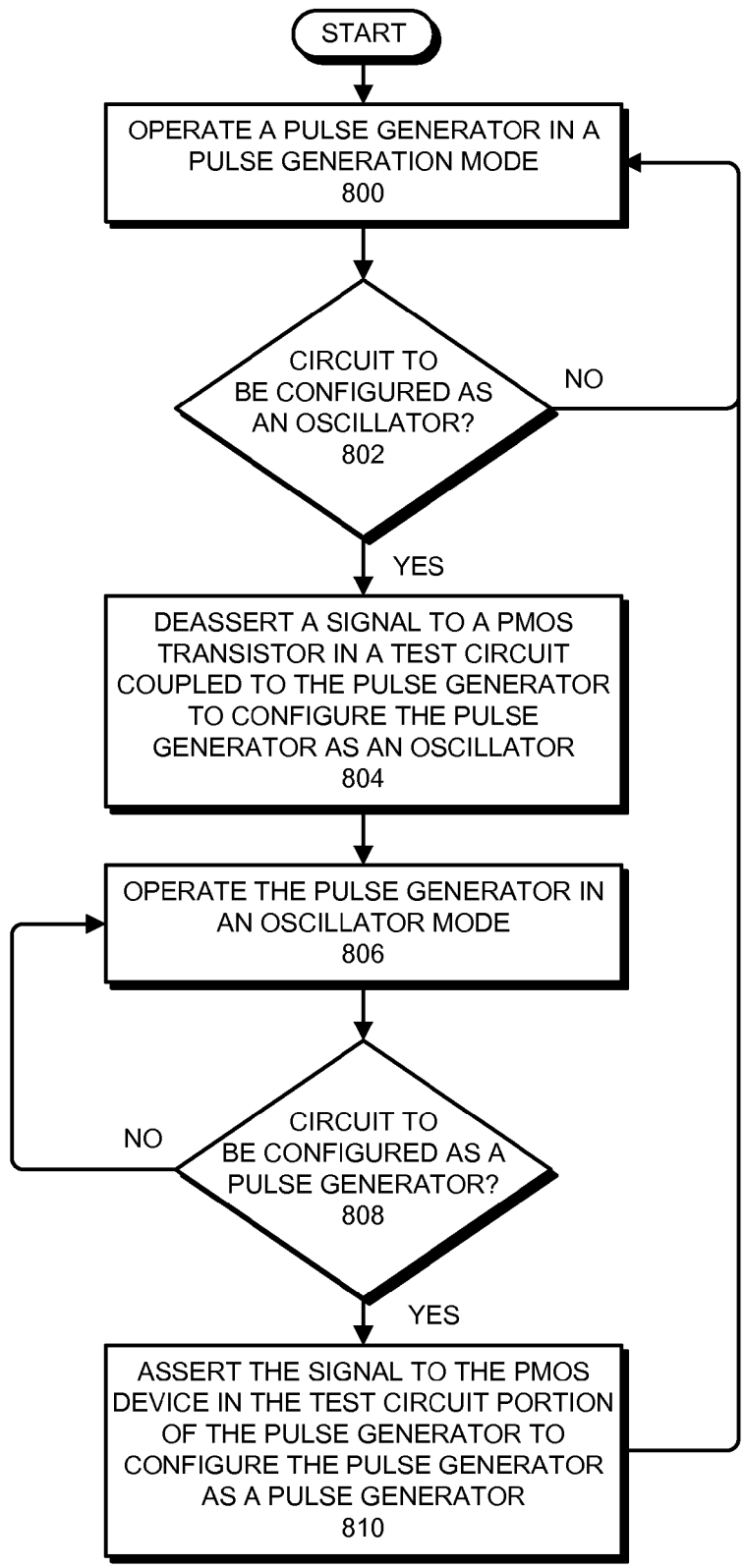
FIG. 8 presents a flowchart illustrating a process for configuring a pulse generator in accordance with the described embodiments.

FIG. 8 presents a flowchart illustrating a process for configuring pulse generator 102 in accordance with the described embodiments. The process starts when system 100 is using pulse generator 102 in a pulse generation mode (step 800). In the pulse generation mode, pulse generator 102 generates pulses that can be used as inputs for downstream circuits (e.g., receiving circuit 104). The downstream circuits can use the pulses as timing signals, data signals, control signals, or for other purposes.

The system then determines if pulse generator 102 is to be configured as an oscillator (step 802). For example, pulse generator circuit 200 can be configured as an oscillator for the purpose of measuring the frequency of the oscillating circuit. Alternatively, pulse generator 102 can be configured as an oscillator to generate an oscillating output for downstream circuits. If pulse generator 102 is not to be configured as an oscillator, system 100 continues operating in the pulse generation mode (step 800).

Otherwise, if pulse generator 102 is to be configured as an oscillator, system 100 deasserts a signal (e.g., oscillation disable 112) to a PMOS transistor in a test circuit portion of pulse generator 102 to configure pulse generator 102 as an oscillator (step 804). As described above with respect to FIG. 2A, deasserting the oscillation disable 112 signal to pulse generator 102 enables a PMOS transistor in a series stack of PMOS transistors in test circuit 202. The other PMOS transistor in test circuit 202 is coupled to a feedback path for pulse generator 102 along with an NMOS pull-down transistor. Hence, the combination of the PMOS transistor and the NMOS transistor forms a complete inversion on the feedback path, making an odd number of inversions in the feedback path and configuring pulse generator 102 as a ring oscillator. As a ring oscillator, pulse generator 102 outputs a periodic waveform with a period that is twice the duration of the pulse that is output by pulse generator 102 in pulse generation mode.

In some embodiments, when oscillation disable 112 is asserted (i.e., when pulse generator is configured as a ring oscillator), clock 108 is held in a logical high state (i.e., held at VDD). In other words, in these embodiments, clock 108 does not oscillate when pulse generator is configured as a ring oscillator.

System 100 then operates pulse generator 102 in the oscillator mode (step 806). As pulse generator 102 is operating in the oscillator mode, the oscillating waveform output by pulse generator 102 can be forwarded to downstream circuits for measurements or for other purposes.

The system then determines if pulse generator 102 is to be configured as a pulse generator (step 808). If not, system 100 continues operating in the oscillator mode (step 806). Otherwise, the system asserts the signal (e.g., oscillation disable 112) to the PMOS transistor in the test circuit portion of the pulse generator to configure the pulse generator as a pulse generator (step 810). Upon the assertion of the oscillation disable 112 signal, the PMOS transistor in the series stack of PMOS transistors in test circuit 202 is disabled, removing the PMOS transistor from the feedback path and restoring the NMOS pull-down transistor to its role as a pull-down transistor within pulse generator 102. System 100 then continues operating in the pulse generation mode (step 800).

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A circuit that can be configured as a pulse generator or as an oscillator, comprising:
   a pulse generator circuit;
   a test circuit coupled to the pulse generator circuit; and
   a disable signal coupled to the test circuit;
   wherein when the disable signal is asserted, the test circuit is disabled, and the pulse generator circuit outputs pulses of a predetermined duration; and
   wherein when the disable signal is deasserted, the test circuit is enabled, so that a transistor in the pulse generator circuit and a transistor in the test circuit are configured as an inverter in a feedback path for the pulse generator circuit, and the pulse generator circuit outputs an oscillating signal.

2. The circuit of claim 1, comprising:
   an n-type metal-oxide-semiconductor field-effect (NMOS) transistor in the pulse generator circuit coupled between an internal node in the pulse generator circuit and VSS, wherein a gate connection for the NMOS transistor is coupled to the feedback path in the pulse generator circuit; and
   two p-type metal-oxide-semiconductor field-effect (PMOS) transistors in the test circuit coupled in series between the internal node in the pulse generator circuit and VDD, wherein a gate connection for the first of the PMOS transistors is coupled to the disable signal, and wherein a gate connection for the second of the PMOS transistors is coupled to the feedback path.

3. The circuit of claim 2, comprising:
   a multiplexer (MUX) with N inputs;
   wherein an output of the MUX is coupled to the second of the PMOS transistors in the test circuit and to the NMOS transistor in the pulse generator circuit;
   wherein each input of the MUX is coupled to one of a set of N separate feedback paths coupled between the pulse generator circuit and the MUX; and
   wherein based on a state of at least one select signal input to the MUX, the MUX couples a selected feedback path to the gates of the second of the PMOS transistors in the test circuit and to the NMOS transistor in the pulse generator circuit.

4. The circuit of claim 3, wherein the set of feedback paths include:
   a first feedback path three gate delays in length;
   a second feedback path five gate delays in length; and
   a third feedback path seven gate delays in length.

5. The circuit of claim 4, wherein each feedback path includes at least one of:
   one or more circuit elements in the pulse circuit; and
   one or more circuit elements coupled to an output of the pulse circuit.

6. The circuit of claim 1, further comprising a frequency-reduction circuit coupled to the pulse generator;
   wherein the frequency-reduction circuit is configured to take the oscillating signal output by the pulse generator as an input and to output a signal with a frequency that is a predetermined fraction of the frequency of the oscillating signal output by the pulse generator.

7. The circuit of claim 1, further comprising a recursive multiplexer coupled to the pulse generator circuit and to one or more other pulse generator circuits, wherein the recursive multiplexer includes a set of OR gates coupled in series;
   wherein an input of each OR gate is coupled to one of the pulse generator circuits and another input of each OR gate is coupled to either VSS or to an output of a previous OR gate; and
   wherein a last OR gate in the recursive multiplexer outputs a signal or a combination of signals received by the recursive multiplexer from the pulse generator circuits.

8. The circuit of claim 1, further comprising a monitoring device coupled to an output of the pulse generator circuit, wherein the monitoring device is configured to:
   receive an oscillating signal output from the pulse generator circuit; and
   use the oscillating signal to compute a pulse duration of a pulse output from the pulse generator circuit.

9. An electronic device, comprising:
   a pulse generator circuit;
   a receiving circuit coupled to the pulse generator circuit, wherein the receiving circuit is configured to receive a signal output by the pulse generator circuit as an input;
   a test circuit coupled to the pulse generator circuit; and
   a disable signal coupled to the test circuit;

wherein when the disable signal is asserted, the test circuit is disabled, and the pulse generator circuit outputs pulses of a predetermined duration; and wherein when the disable signal is deasserted, the test circuit is enabled, so that a transistor in the pulse generator circuit and a transistor in the test circuit are configured as an inverter in a feedback path for the pulse generator circuit, and the pulse generator circuit outputs an oscillating signal.

10. The electronic device of claim 9, comprising:
an NMOS transistor in the pulse generator circuit coupled between an internal node in the pulse generator circuit and VSS, wherein a gate connection for the NMOS transistor is coupled to the feedback path in the pulse generator circuit; and
two PMOS transistors in the test circuit coupled in series between the internal node in the pulse generator circuit and VDD, wherein a gate connection for the first of the PMOS transistors is coupled to the disable signal, and wherein a gate connection for the second of the PMOS transistors is coupled to the feedback path.

11. The electronic device of claim 10, comprising:
a MUX with N inputs;
wherein an output of the MUX is coupled to the second of the PMOS transistors in the test circuit and to the NMOS transistor in the pulse generator circuit;
wherein each input of the MUX is coupled to one of a set of N separate feedback paths coupled between the pulse generator circuit and the MUX; and
wherein based on a state of at least one select signal input to the MUX, the MUX couples a selected feedback path to the gates of the second of the PMOS transistors in the test circuit and to the NMOS transistor in the pulse generator circuit.

12. The electronic device of claim 11, wherein the set of feedback paths include:
a first feedback path three gate delays in length;
a second feedback path five gate delays in length; and
a third feedback path seven gate delays in length.

13. The electronic device of claim 12, wherein each feedback path includes at least one of:
one or more circuit elements in the pulse circuit; and
one or more circuit elements coupled to an output of the pulse circuit.

14. The electronic device of claim 9, further comprising a frequency-reduction circuit coupled to the pulse generator;
wherein the frequency-reduction circuit is configured to take the oscillating signal output by the pulse generator as an input and to output a signal with a frequency that is a predetermined fraction of the frequency of the oscillating signal output by the pulse generator.

15. The electronic device of claim 9, further comprising a recursive multiplexer coupled to the pulse generator circuit and to one or more other pulse generator circuits, wherein the recursive multiplexer includes a set of OR gates coupled in series;
wherein an input of each OR gate is coupled to one of the pulse generator circuits and an other input of each OR gate is coupled to either VSS or to an output of a previous OR gate; and
wherein a last OR gate in the recursive multiplexer outputs a signal or a combination of signals received by the recursive multiplexer from the pulse generator circuits.

16. The electronic device of claim 9, further comprising a monitoring device coupled to an output of the pulse generator circuit, wherein the monitoring device is configured to:
receive an oscillating signal output from the pulse generator circuit; and
use the oscillating signal to compute a pulse duration of a pulse output from the pulse generator circuit.

17. A method for using a pulse generator circuit as an oscillator, comprising:
operating the pulse generator in a pulse generation mode;
upon determining that the circuit is to be configured as an oscillator, deasserting a disable signal to a test circuit coupled to the pulse generator to configure an NMOS transistor in the pulse generator circuit and a PMOS transistor in the test circuit as an inverter on a feedback path for the pulse generator circuit, thereby configuring the pulse generator circuit as a ring oscillator; and
operating the pulse generator circuit in an oscillator mode.

18. The method of claim 17, wherein the method further comprises:
operating the pulse generator circuit in the oscillator mode;
upon determining that the pulse generator is to be configured as a pulse generator, asserting the disable signal to the test circuit coupled to the pulse generator to block the PMOS transistor in the test circuit and leave the NMOS transistor alone on the feedback path for the pulse generator circuit, thereby configuring the pulse generator circuit as a pulse generator; and
operating the pulse generator in a pulse generation mode.

19. The method of claim 17, wherein the method further comprises:
using a frequency-reduction circuit to reduce the frequency of an oscillating output signal output by the pulse generator in the oscillator mode; and
outputting a reduced-frequency oscillating signal from the frequency-reduction circuit.

20. The method of claim 19, wherein the method further comprises:
measuring the reduced-frequency oscillating signal to determine a frequency of the reduced-frequency oscillating signal; and
from the measured frequency, determining a duration of a pulse output by the pulse generator in the pulse generation mode.

* * * * *